United States Patent [19]
Grewal

[11] Patent Number: 4,764,245
[45] Date of Patent: Aug. 16, 1988

[54] METHOD FOR GENERATING CONTACT HOLES WITH BEVELED SIDEWALLS IN INTERMEDIATE OXIDE LAYERS

[75] Inventor: Virinder Grewal, Ebersberg, Fed. Rep. of Germany

[73] Assignee: Siemens Aktiengesellschaft, Berlin and Munich, Fed. Rep. of Germany

[21] Appl. No.: 19,367

[22] Filed: Feb. 26, 1987

[30] Foreign Application Priority Data

May 7, 1986 [DE] Fed. Rep. of Germany ....... 3615519

[51] Int. Cl.$^4$ .............................................. B44C 1/22
[52] Int. Cl.$^4$ .................................. 156/643; 156/676; 156/651; 156/652; 156/656; 156/657; 156/664; 252/79.3
[58] Field of Search ............... 252/79.3; 156/643, 646, 156/651, 652, 653, 656, 657, 664

[56] References Cited

U.S. PATENT DOCUMENTS

| | | | |
|---|---|---|---|
| 4,522,681 | 6/1985 | Gorowitz et al. | 156/653 |
| 4,584,055 | 4/1986 | Kayanuma et al. | 156/643 |
| 4,595,453 | 6/1986 | Yamazaki et al. | 156/643 |
| 4,666,555 | 5/1987 | Tsang | 252/79.1 |
| 4,680,085 | 7/1987 | Vijar et al. | 156/657 |

OTHER PUBLICATIONS

Bersin, Richard L., "A Survey of Plasma Etching Processes" Solid State Tech. May 1976.
Chang "Selective Reactive Ion Etching of Silicon Dioxide" Solid State Technology, Apr. 1964, pp. 214 to 219.
Choe et al., "Production RIE-1., Selective Dielectrics Etching" Solid State Technology, Apr. 1984, pp. 177 to 183.
Lam Research, "Refining Etch Technology" Publication date unknown.

*Primary Examiner*—David L. Lacey
*Assistant Examiner*—Lori-Ann Johnson
*Attorney, Agent, or Firm*—Hill, Van Santen, Steadman & Simpson

[57] ABSTRACT

A method for producing contact holes having sloped walls in intermediate oxide layers through combination of isotropic and anisotropic etching steps which are carried out by means of dry etching in a fluorine-containing plasma. The first etching step is an isotropic etching using an etching gas mixture in which the free fluorine atoms for the isotropic etching step are partially replaced by free $CF_3$ radicals and ions for the anisotropic etching step. The last etching step is carried out anisotropically. Simultaneously, the electrode spacing in the reactor is reduced during the etching process. Sidewall angles between 60° and 90° can be reproduced with the method of the present invention. The method is particularly useful for the manufacture of large scale integrated semiconductor circuits.

6 Claims, 1 Drawing Sheet

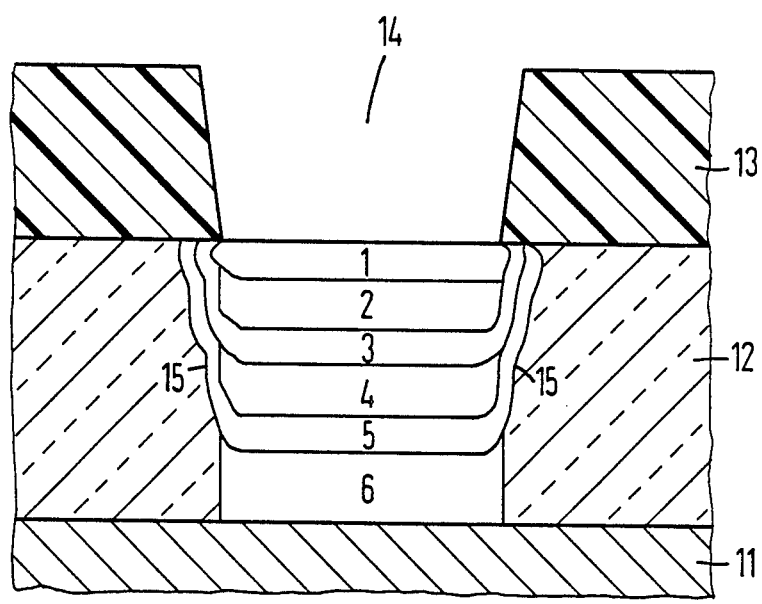

METHOD FOR GENERATING CONTACT HOLES WITH BEVELED SIDEWALLS IN INTERMEDIATE OXIDE LAYERS

BACKGROUND OF THE INVENTION

1. Field of the Invention

The present invention is in the field of dry etching of contact holes having beveled sidewalls and insulating layers composed of $SiO_2$, the layers being employed as intermediate oxide layers in the manufacture of large scale integrated semiconductor circuits. The etching is carried out in a plasma containing a fluorine-containing etchant.

2. Description of the Prior Art

The steps between the various wiring levels consisting, for example, of polysilicon levels and aluminum interconnect levels which occur in very large scale integration technology require a leveling of the intermediate oxide which possesses good flow properties at low temperatures in order to provide a successful edge coverage at the succeeding steps. A phosphorusdoped or boron-doped silica glass meet this requirement very well. Contact holes which also must meet the demands of the aluminum edge coverage must be etched in the layers referred to as the intermediate oxide layers.

SUMMARY OF THE INVENTION

The present invention provides a method for the manufacture of contact holes having beveled or sloped sidewalls and which meet the following requirements:

1. The method should be preferably usable in one dry etching system.
2. The sidewall angle should be reproducible between 60° and 90°.
3. The etching should proceed uniformly to an extent of ±5% on the entire silicon crystal wafer.
4. The contact holes should be accurately dimensioned.

The selectivity between the oxide and the polycrystalline silicon lying below the oxide should be in the ratio of at least 10-15:1, and the ratio between the oxide and the photoresist which serves as an etching mask should be in the ratio of at least 4:1.

A report by J.S. Chang in Solid State Technology, April 1984, pages 214-219 and a report by Choe, Knapp and Jacob in the same periodical, pages 177 through 183, disclose methods for beveling contact hole sidewalls, referred to as sloped sidewalls, by means of erosion of the photoresist. These references are incorporated herein by reference. These methods proceed on the concept of simultaneous erosion of the photoresist material during the anisotropic oxide etching with trifluoromethane ($CHF_3$) or mixtures of trifluoromethane and oxygen as the etching gases. The erosion rate of the resist is controlled by the quantity of added oxygen.

Large topographical differences occur in silicon crystal wafers which are processed in VLSI technology, so that a technique known as the tri-level technique must be employed. This procedure involves first, applying a relatively thick (about 1.5 to 2.5 micron) lacquer layer to the silicon wafer. A spin-on glass layer is then applied and a layer of photoresist material is applied to the latter. After exposure and development of the photoresist layer, the spin-on glass layer is anisotropically etched. The spin-on glass layer serves as a mask for the structuring of the lacquer layer in a reactive ion etching plasma with oxygen. The process of generating sloped walls in the contact hole etching by means of photoresist erosion cannot be utilized in this process.

The combination of wet chemical isotropic and anisotropic dry etching processes has a disadvantage that the oxide etching rate in the wet chemical method is greatly dependent on the doping. In this instance, the lateral etching rate is frequently far greater than the vertical etching rate. This process can therefore be only occasionally employed to produce a good sloping having the aforementioned requirements.

The present invention achieves the stated objective by employing an etching process which contains both isotropic and anisotropic etching steps, the first step being isotropically carried out in an atmosphere containing free fluorine atoms and succeeding steps being initially carried with retention of the isotropic etching components in an atmosphere containing free $CF_3$ radicals and ions whereby, as etching proceeds, the content of fluorine atoms is adjusted in favor of the formation of $CF_3$ radicals and ions in the plasma with simultaneous reduction of the electrode spacing in the reactor.

In accordance with the present invention, it is preferred to use carbon tetrafluoride ($CF_4$) and/or ammonium trifluoride ($NF_3$) mixed with oxygen as the etching gas for the isotropic etching components and carbon tetrafluoride mixed with trifluoromethane and argon or helium or nitrogen as the anisotropic etching component. The electrode spacing in the isotropic etching is adjusted to greater than 1 cm and is adjusted to less than 1 cm in the anisotropic etching. The process can be carried out most conveniently with continuous modification of the gas mixture concentration and the electrode spacing in a single plate reactor.

In one form of the invention, the process is carried out in stages, whereby isotropic etching is carried out in the first stage and anisotropic etching is carried out in the last stage. In this type of multi-stage process, it is advantageous to achieve high selectivity to polycrystalline silicon in the last stage, so that the last stage may be carried out in a different chamber which is suitable for such high selectivity.

A combined isotropic/anisotropic etching process composed of six steps will be set forth in greater detail below with reference to the single Figure which shows a simulated model.

BRIEF DESCRIPTION OF THE DRAWINGS

The FIGURE shows the sequential etching steps forming a contact hole having sloped walls.

DESCRIPTION OF THE PREFERRED EMBODIMENTS

In the single Figure, the polycrystalline silicon which may, for example, be the surface of a gate electrode, is identified at reference numeral 11. The oxide layer composed of boron-doped phosphorus-silicate glass is designated by reference numeral 12 while the photoresist which has been structured by exposure and development is identified at reference numeral 13. A contact hole 14 is provided, with sloped walls which are identified at reference numeral 15.

The numbers 1 to 6, inclusive, refer to the extent of the individual etching steps after each of the numbered steps. The etching step 1 consists of an exclusively isotropic etching step while the final step, step 6, is exclusively an anisotropic etching step.

The following specific conditions can be used in each of the individual steps.

Step 1: An etching gas composed of a mixture of carbon tetrafluoride with 10% oxygen (at 30 sccm) and trifluoroammonia having an overall pressure of 312 Pa and an electrode spacing of 3 to 5 cm are employed. The etching is isotropic due to free F in plasma. V.A Step 2: In this step, an etching gas consisting of a gas mixture of $CF_4$, $CHF_3$ and helium or argon or a mixture of $C_2F_6$, $CHF_3$ and argon or helium are employed. The overall pressure is adjusted to 312 Pa with an electrode spacing of 0.8 cm. The etching is anisotropic due to $CF_3$ radicals and lous and less free F in plasma V.A.

Step 3: The etching gas is composed of a gas mixture of carbon tetrafluoride with 10% oxygen (30 sccm) and trifluoroammonia. The overall pressure is 312 Pa with an electrode spacing of 3 to 5 cm.

Step 4: The etching gas is composed of a gas mixture of $CF_4$, $CHF_3$ and helium or argon or a mixture of $C_2F_6$, $CHF_3$ and argon or helium. The overall pressure is 312 Pa with an electrode spacing of 0.8 cm.

Step 5: The etching gas is composed of a gas mixture of carbon tetrafluoride with 10% oxygen (30 sccm) and trifluoroammonia having an overall pressure of 312 Pa. The electrode spacing is 3 to 5 cm.

Step 6: The etching gas is a mixture of carbon tetrafluoride, trifluoromethane and argon having an overall pressure of 312 Pa. The electrode spacing is 0.8 cm.

The method is preferably carried out in a single-plate plate reactor. The pressure existing in the reactor is maintained in the range from 40 Pa to 533 Pa.

Numerous variations can also be made in the described embodiments. For example, the etchant for isotropic etching can include sulfur hexafluoride in place of trifluoroammonia.

I claim as my invention:

1. A method for generating contact holes having sloped walls in a silica-containing insulating layer which comprises:

dry plasma etching a silica-containing insulating layer in a reactor using an electrode generated plasma, said plasma including a fluorine-containing etchant, said dry plasma etching being carried out in a plurality of isotropic and anisotropic etching steps, the first etching step being carried out isotropically in an atmosphere containing free fluorine atoms and subsequent etching steps being initially carried out with retention of the isotropic etching components in an atmosphere also containing free $CF_3$ radicals and ions, adjusting the content of fluorine atoms in the atomsphere as etching proceeds in the direction favoring formation of $CF_3$ radicals and ions, and reducing the electrode spacing in the plasma as etching proceeds to thereby form contact holes having sloped walls.

2. A method according to claim 1 wherein carbon tetrafluoride or trifluoroammonia mixed with oxygen or mixtures thereof are used for the isotropic etching and carbon tetrafluoride mixed with trifluoromethane and argon, helium or nitrogen are employed for the anisotropic etching.

3. A method according to claim 1 wherein the electrode spacing during isotropic etching is greater than 1 cm and less than 1 cm during anisotropic etching.

4. A method according to claim 1 wherein said etching is carried out in a single-plate plate reactor.

5. A method according to claim 1 wherein the etchant for isotropic etching includes sulfur hexafluoride.

6. A method according to claim 1 wherein the pressure in said reactor is maintained in the range from 40 Pa to 533 Pa.

* * * * *